United States Patent
Tran et al.

(10) Patent No.: US 8,916,872 B1
(45) Date of Patent: Dec. 23, 2014

(54) METHOD OF FORMING A STACKED LOW TEMPERATURE DIODE AND RELATED DEVICES

(71) Applicant: Inoso, LLC, Austin, TX (US)

(72) Inventors: Ziep Tran, Austin, TX (US); Kiyoshi Mori, Missouri City, TX (US); Giang Trung Dao, Milpitas, CA (US); Michael Edward Ramon, Austin, TX (US)

(73) Assignee: Inoso, LLC, Austin, TX (US)

( * ) Notice: Subject to any disclaimer, the term of this patent is extended or adjusted under 35 U.S.C. 154(b) by 0 days.

(21) Appl. No.: 14/329,792

(22) Filed: Jul. 11, 2014

(51) Int. Cl.
| | |
|---|---|
| *H01L 29/40* | (2006.01) |
| *H01L 29/88* | (2006.01) |
| *H01L 29/872* | (2006.01) |
| *H01L 29/66* | (2006.01) |
| *H01L 21/265* | (2006.01) |
| *H01L 29/04* | (2006.01) |
| *H01L 27/22* | (2006.01) |
| *H01L 27/24* | (2006.01) |

(52) U.S. Cl.
CPC ........ *H01L 29/872* (2013.01); *H01L 29/66143* (2013.01); *H01L 21/26506* (2013.01); *H01L 29/04* (2013.01); *H01L 27/224* (2013.01); *H01L 27/2427* (2013.01); *Y10S 438/979* (2013.01)
USPC 257/46; 257/104; 257/E21.352; 257/E21.366; 257/E27.051; 257/E29.328; 438/979

(58) Field of Classification Search
USPC .............. 438/91, 979; 257/46, 104, E27.051, 257/E27.073, E29.328, E21.352, E21.366
See application file for complete search history.

(56) References Cited

U.S. PATENT DOCUMENTS

| 4,237,600 | A | 12/1980 | Rosen et al. |
|---|---|---|---|
| 5,006,913 | A | 4/1991 | Sugahara et al. |
| 5,808,319 | A | 9/1998 | Gardner et al. |
| 5,950,082 | A | 9/1999 | Gardner |
| 7,067,868 | B2 | 6/2006 | Thean et al. |
| 7,211,824 | B2 * | 5/2007 | Lazarev .................. 257/40 |
| 8,203,154 | B2 | 6/2012 | Wang et al. |
| 8,410,582 | B2 | 4/2013 | Bandyopadhyay et al. |
| 2009/0001344 | A1 | 1/2009 | Schricker et al. |
| 2009/0085153 | A1 | 4/2009 | Maxwell et al. |
| 2013/0229846 | A1 | 9/2013 | Chien et al. |

OTHER PUBLICATIONS

Yuta Tamura, "A Novel Interface Controlled Silicidation Process for Future 3D Schottky Devices", Master Thesis, 2013, Department of Electrical and Electronic Engineering, Tokyo Institute of Technology.

(Continued)

*Primary Examiner* — Hoai V Pham
(74) *Attorney, Agent, or Firm* — Haynes and Boone, LLP

(57) ABSTRACT

A method of forming a stacked low temperature diode and related devices. At least some of the illustrative embodiments are methods comprising forming a metal interconnect disposed within an inter-layer dielectric. The metal interconnect is electrically coupled to at least one underlying integrated circuit device. A barrier layer is deposited on the metal interconnect and the inter-layer dielectric. A semiconductor layer is deposited on the barrier layer. A metal layer is deposited on the semiconductor layer. The barrier layer, the semiconductor layer, and the metal layer are patterned. A low-temperature anneal is performed to induce a reaction between the patterned metal layer and the patterned semiconductor layer. The reaction forms a silicided layer within the patterned semiconductor layer. Moreover, the reaction forms a P-N junction diode.

27 Claims, 18 Drawing Sheets

(56) References Cited

OTHER PUBLICATIONS

Yang, et al, "Stability of Low-Temperature Amorphous Silicon Thin Film Transistors Formed on Glass and Transparent Plastic Substrates", J. Vac. Sci. Technol. B, Mar.-Apr. 2000, pp. 683-689.

Bipin Rajendran, "Sequential 3D IC Fabrication—Challenges and Prospects", Proceedings of VMIC, 2006.

Wei Sun, et al, "Harvesting Betavoltaic and Photovoltaic Energy with Three Dimensional Porous Silicon Diodes", MRS Proceedings, 2004, vol. 836.

"Principles of Semiconductor Devices", 2004, http://ecee.colorado.edu/~bart/book/book/chapter3/ch3_1.htm, Boulder, CO.

Mark D. Barlow, "Metal-Semiconductor Contacts for Schottky Diode Fabrication", Master Thesis, 2007, Electrical and Computer Engineering Program, Youngstown State University.

\* cited by examiner

METHOD OF FORMING A STACKED LOW TEMPERATURE DIODE AND RELATED DEVICES

CROSS REFERENCE TO RELATED APPLICATIONS

The present disclosure is related to the subject matter of commonly assigned, co-pending application Ser. No. 14/329,759, filed on even date herewith, the entirety of which is herein incorporated by reference.

BACKGROUND

1. Technical Field

The present invention generally relates to semiconductor devices. More particularly, the present invention relates to the integration of stacked low temperature semiconductor devices with metal-oxide-semiconductor (MOS) devices and processes.

2. Description of the Related Art

The ever increasing demand of small, portable multifunctional electronic devices has led to the continued proliferation of smart phones, personal computing devices, personal audio devices (e.g., MP3 players), as well as biomedical and security devices. Such devices are expected to support and perform a greater number of increasingly complex and sophisticated functions while consuming less and less power. Such electronic devices rely on limited power sources (e.g., batteries and/or alternative energy harvesting systems) while providing ever-increasing processing capabilities and storage capacity.

Accordingly, there is a continuing trend in the semiconductor industry to manufacture not only high functionality, high-performance, low-power integrated circuits (ICs), but also low cost ICs. These goals have been achieved in large part by scaling down the semiconductor IC dimensions and stacking IC chips and thus increasing circuit densities and functionality. Achieving higher densities calls for smaller feature sizes, smaller separations between features and layers, and more precise feature shapes. The scaling down of IC dimensions and reduction of parasitic resistances and capacitances can facilitate faster circuit performance (e.g., faster switching speeds) and can lead to higher effective yield in IC fabrication processes by packing more circuits on a semiconductor die and/or more die on a semiconductor wafer. However, continued scaling also introduces considerable challenges. For example, as the minimum feature size of MOS devices has decreased, the OFF state leakage current has increased, and is rapidly approaching ON state current levels. In addition, transistor density is limited by the amount of area that is required between devices in order to electrically isolate them from each other.

SUMMARY

The problems noted above are solved in large part by a method of forming a stacked low temperature diode and related devices. At least some of the illustrative embodiments are methods comprising forming a metal interconnect disposed within an inter-layer dielectric. The metal interconnect is electrically coupled to at least one underlying integrated circuit device. A barrier layer is deposited on the metal interconnect and the inter-layer dielectric. A semiconductor layer is deposited on the barrier layer. A metal layer is deposited on the semiconductor layer. The barrier layer, the semiconductor layer, and the metal layer are patterned. A low-temperature anneal is performed to induce a reaction between the patterned metal layer and the patterned semiconductor layer. The reaction forms a silicided layer within the patterned semiconductor layer. Moreover, the reaction forms a P-N junction diode.

Other illustrative embodiments are methods comprising forming a metal interconnect disposed within an inter-layer dielectric. The metal interconnect is electrically coupled to at least one underlying integrated circuit device. A first low-temperature P-N junction diode is formed on the metal interconnect. A second low-temperature P-N junction diode is formed on the first low-temperature P-N junction diode. The second low-temperature P-N junction diode is electrically coupled to the first low-temperature P-N junction diode by way of a VIA.

Yet other illustrative embodiments are semiconductor devices comprising a metal interconnect disposed within an inter-layer dielectric, a barrier layer on the metal interconnect and the inter-layer dielectric, a semiconductor layer on the barrier layer, and a metal layer on the semiconductor layer. The metal interconnect is electrically coupled to at least one underlying integrated circuit device. The barrier layer, the semiconductor layer, and the metal layer are patterned. The semiconductor device is annealed to induce a reaction between the patterned metal layer and the patterned semiconductor layer. The reaction forms a silicided layer within the patterned semiconductor layer. Moreover, the reaction forms a P-N junction diode.

The above summary contains simplifications, generalizations and omissions of detail and is not intended to be a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

For a more detailed description of the various embodiments, the detailed written description can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
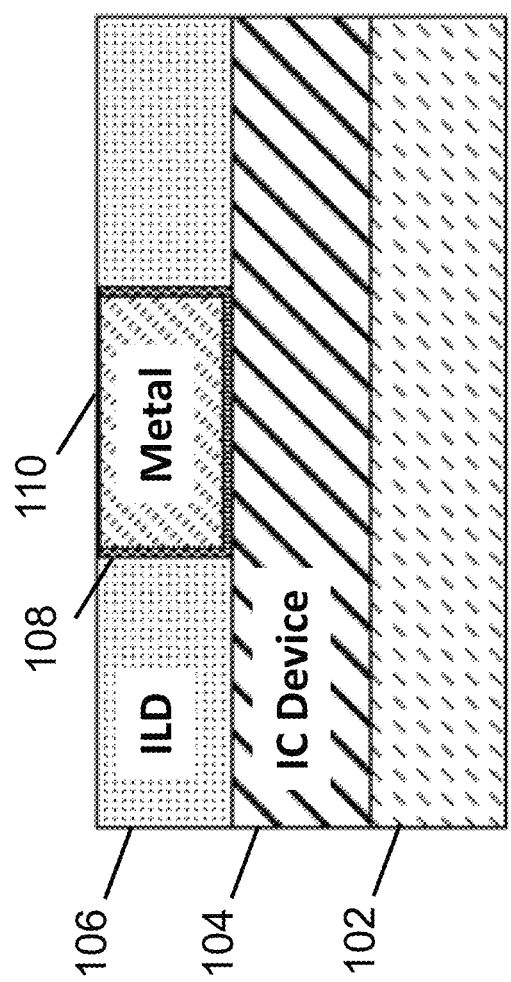
FIG. 1 shows a cross sectional view illustrating the formation of a stacked low temperature diode after formation of a patterned dielectric layer including a metal layer.

The following discussion is directed to various embodiments which provide a method of forming a stacked low temperature diode and related devices. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections. Unless otherwise stated, when a layer is said to be "deposited over the substrate" or "formed over the substrate", it means that the layer is deposited or formed over any topography that already exists on the substrate. Also, the term "thermal budget" is used to define an amount of thermal energy transferred to a semiconductor wafer (e.g., during a high-temperature process) and is given as a product of temperature (e.g., in degrees Kelvin) and time (e.g., in seconds). Low thermal budget processes are preferred, for example, to prevent dopant redistribution or electromigration.

The subject matter disclosed herein is directed to methods associated with formation of one or more stacked low temperature diodes over an IC device, such as a complementary metal-oxide-semiconductor (CMOS) device, a bipolar-CMOS (BiCMOS) device, an n-type MOS (NMOS) device, a p-type (PMOS) device. Other methods of diode stacking have been reported, however existing approaches require high-temperature processing for diode fabrication. Such high-temperature approaches greatly reduce their compatibility, in particular, for insertion into the back-end of existing CMOS process flows. For example, in some cases, it may be desirable to fabricate devices and/or circuitry on the back-end of a process flow rather than to fabricate a separate IC chip and subsequently bond the two IC chips, which can add significant cost, time and parasitic resistance. Thus, an improved method for forming a stacked low temperature diode and related devices, as described with reference to FIGS. 1-18 is needed.

Referring to FIG. 1, any of a plurality of IC devices is formed within an IC device layer 104 of semiconductor substrate 102, in accordance with standard semiconductor processing techniques. The plurality of IC devices includes, in various embodiments, a CMOS device, a BiCMOS device, an NMOS device, and/or a PMOS device, among others. Further, the plurality of IC devices formed within the IC device layer 104 may collectively form one or more of a logic circuit, a central processing unit (CPU), a memory, a memory controller, an input/output (I/O) interface, a cache, a network interface, and/or subsystems of these devices/circuits. In various embodiments, the substrate 102 comprises single crystal silicon (Si). In other embodiments, the substrate 102 comprises for example, a silicon germanium (SiGe) substrate, a germanium (Ge) substrate, or a silicon-on-insulator (SOI) substrate. In yet other embodiments, the substrate 102 comprises a silicon carbide (SiC) substrate, a gallium arsenide (GaAs) substrate, an indium arsenide (InAs) substrate, an indium gallium arsenide (InGaAs) substrate, an indium phosphide (InP), or another substrate as well known in the art.

Figure 2:
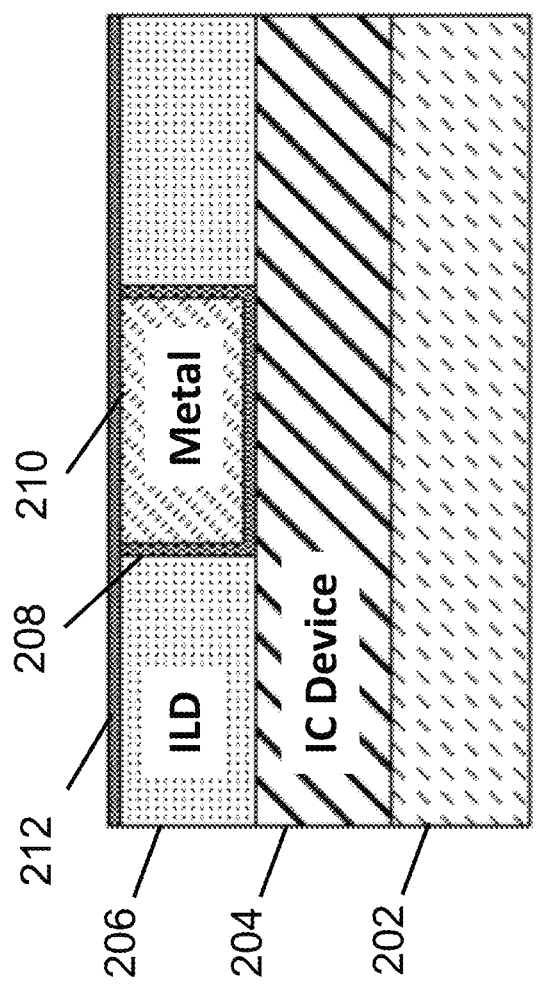
FIG. 2 shows a cross sectional view illustrating the formation of a stacked low temperature diode after formation of a barrier layer.

A dielectric layer 106 is deposited over the IC device layer 104. The dielectric layer 106 may include an interlayer dielectric or a dielectric capping layer, among others. Depending on the material used for the dielectric layer 106, the dielectric layer 106 can be formed by a variety of techniques (e.g., thermal or plasma enhanced chemical vapor deposition (CVD), atomic layer deposition (ALD), or CVD oxide followed by CVD- or ALD-deposited silicon nitride). The dielectric layer 106 is patterned, and a barrier layer 108 and a metal layer 110 (e.g., a copper layer comprising part of a Cu interconnect layer) are deposited, for example, by way of a damascene or dual damascene process. In some embodiments which utilize a damascene process, the barrier layer 108 is deposited over the patterned dielectric layer 106, for example, to prevent Cu diffusion. In various embodiments, the barrier layer 108 may include one or more of a Ta layer, a TaN layer, or a TiN layer, and the barrier layer 108 may have a thickness of about 50-500 Angstroms. The metal layer 110 is then deposited over the barrier layer 108. In some embodiments, the metal layer 110 includes a Cu layer, and deposition of the metal layer 110 includes deposition of a Cu seed layer (e.g., by a PVD or CVD process) followed by a Cu electroplating process. Depending in part on the metal used for the metal layer 110, the metal layer 110 may serve as a cathode or anode of a P-N junction diode. In some embodiments, the metal layer 110 includes a Cu layer which serves as the cathode of the P-N diode, as described below. A chemical mechanical polishing (CMP) process can be used for surface planarization. As shown in FIG. 2, a barrier layer 212 is formed over the substrate. In some embodiments, the barrier layer 212 includes one or more of a Ta layer, a TaN layer, or a TiN layer, and the barrier layer 212 may have a thickness of about 50-500 Angstroms.

It should also be noted that, at times, throughout the discussion herein, the same features and/or elements have been generally numbered in accordance with the corresponding figure number in which the feature and/or element appears. For example, semiconductor substrate 202 is substantially the same as the semiconductor substrate 102, IC device layer 204 is substantially the same as the IC device layer 104, dielectric layer 206 is substantially the same as the dielectric layer 106, etc. Other features and/or elements may be similarly numbered herein; however, such numbering does not necessarily imply a different element and/or feature than that which has been previously presented in a prior figure.

Figure 3:
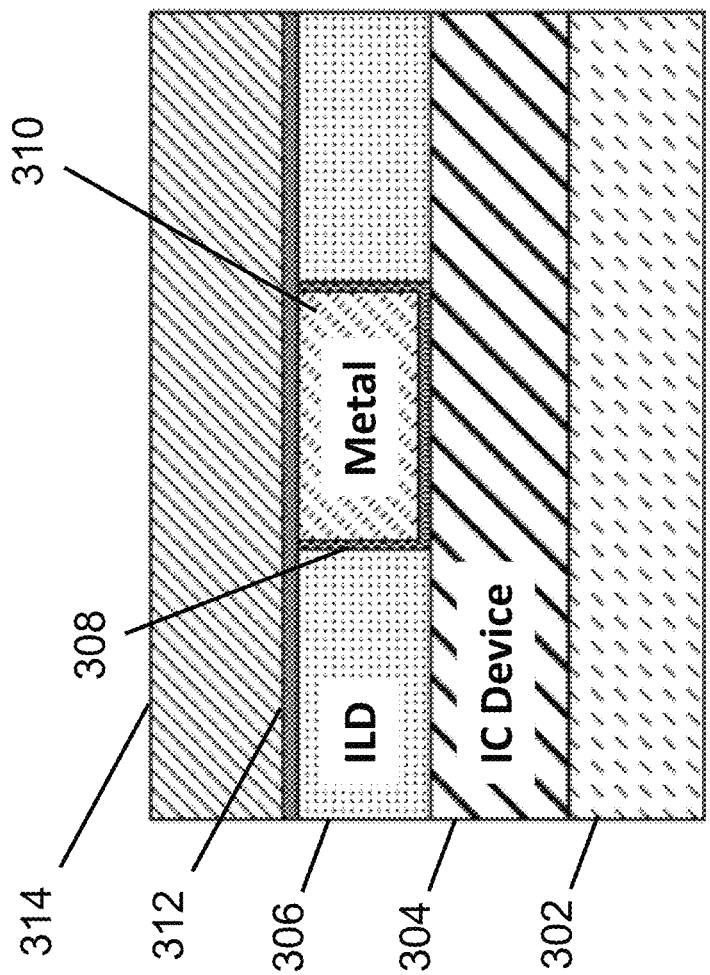
FIG. 3 shows a cross sectional view illustrating the formation of a stacked low temperature diode after formation of semiconductor layer.

Referring now to FIG. 3, a semiconductor layer 314 is then formed over the substrate. The semiconductor layer 314 may be formed by various techniques including ALD, CVD, metal-organic CVD (MOCVD), physical vapor deposition (PVD), and layer transfer, among others. In various embodiments, the semiconductor layer 314 comprises a layer selected from a group of layers including an amorphous silicon (a-Si) layer, a polycrystalline Si (poly-Si) layer, a single crystal Si layer, an amorphous silicon-germanium (a-SiGe) layer, a polycrystalline silicon germanium (poly-SiGe) layer, a single crystalline SiGe layer, an amorphous germanium (a-Ge) layer, a polycrystalline germanium (poly-Ge) layer, a single crystal Ge layer, and silicon carbide (SiC), as well as any combination of one or more of these films. In some embodiments, for example when the semiconductor layer 314 includes an amorphous or polycrystalline layer, a low-temperature anneal may be used to crystallize the semiconductor layer 314. The low-temperature anneal may include a laser annealing process performed at an energy density of about 500-1000 mJ/cm$^2$. In other embodiments, other low-temperature heat treatment processes may be used, where the temperature may be chosen based on the composition of underlying layer materials, and where the temperature is less than the critical temperature of such underlying materials. For example, in some embodiments, if an underlying layer includes tungsten (W), the anneal temperature may be less than about 950 degrees Celsius. In other embodiments, if an underlying layer includes nickel silicide (NiSi), the anneal temperature may be less than about 600 degrees Celsius. In yet other embodiments, if an underlying layer includes aluminum (Al), the anneal temperature may be less than about 550 degrees Celsius. In some embodiments where an underlying layer includes copper (Cu), the anneal temperature may be less than about 400 degrees Celsius. Other anneal temperatures and other laser annealing energy densities, based on various other underlying material types, will be apparent to those skilled in the art. In various embodiments, the semiconductor layer 314 includes a semiconductor layer having a thickness of about 2000-5000 Angstroms. In some embodiments, the semiconductor layer 314 may also be doped with a dopant species (e.g., boron, phosphorous, arsenic), resulting in an N- or P-type doping of the semiconductor layer 314. For example, the semiconductor layer 314 may be N-type doped when metal layer 310 is to serve as a P-N junction cathode, and the semiconductor layer 314 may be P-type doped when metal layer 310 is to serve as a P-N junction anode. In various embodiments, doping of the semiconductor layer 314 may be accomplished by depositing an in-situ doped semiconductor layer including at least one of an N-type dopant and a P-type dopant. In some embodiments, the semiconductor layer 314 includes one of a gradient dopant profile and a bilayer dopant profile.

Figure 4:
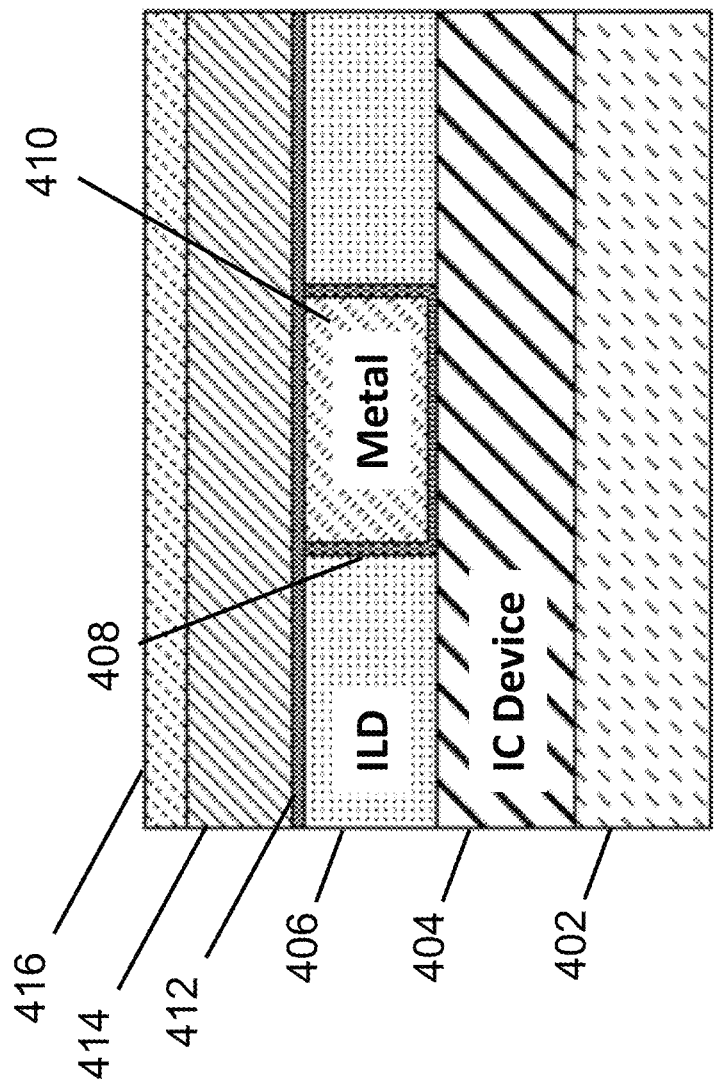
FIG. 4 shows a cross sectional view illustrating the formation of a stacked low temperature diode after deposition of a metal layer over the semiconductor layer.

As shown in FIG. 4, a metal layer 416 is deposited over the substrate 402. Depending on the doping of the semiconductor layer 414, and thus depending on whether the metal layer 410 serves as a P-N junction anode or cathode, the metal layer 416 may comprise any of a plurality of metals. For example, when the semiconductor layer 414 is used as the cathode, the metal layer 416 may include platinum (Pt) or nickel (Ni), which will be used to form the anode, as described below. Alternatively, when the semiconductor layer 414 is used as the anode, the metal layer 416 may include erbium (Er), ytterbium (Yb), or palladium (Pd), which will be used to form the cathode, as described below. The metal layer 416 serves as a precursor to silicidation of the anode/cathode within the semiconductor layer 414. In various embodiments, the metal layer 416 is deposited by PVD, ALD, or e-beam evaporation, among others, and the metal layer 416 has a thickness of about 50-500 Angstroms.

Figure 5:
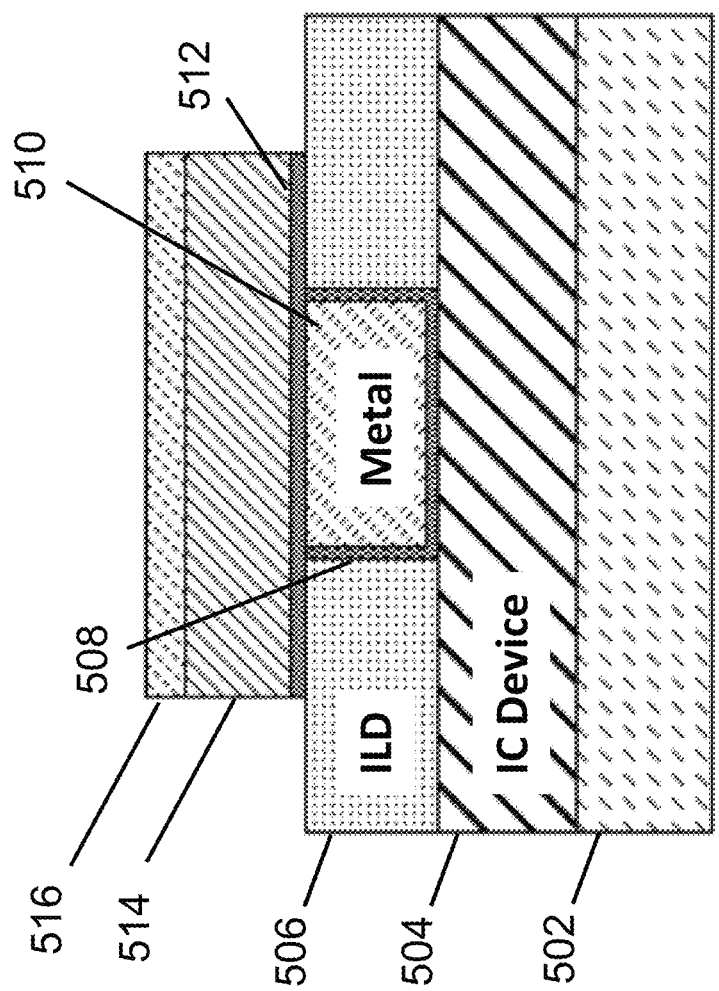
FIG. 5 shows a cross sectional view illustrating the formation of a stacked low temperature diode after patterning the semiconductor layer and the metal layer.

As shown in FIG. 5, the semiconductor layer 414 (FIG. 4) and metal layer 416 (FIG. 4) are then patterned and etched to form an active region including patterned layer 514 and patterned metal layer 516. The patterning can be accomplished by way of a photolithographic process. In a photolithographic process, a patterned light sensitive layer can serve as a mask for an underlying layer or layers, wherein portions of the underlying layer or layers not protected by the light sensitive layer can be etched, ion implanted, or otherwise processed. In the example of FIG. 5, the regions of the semiconductor layer 414 and metal layer 416 (FIG. 4) which are not protected by the light sensitive layer are etched to form the active region which includes the patterned layer 514 and the patterned metal layer 516. In various embodiments, ILD layer 506 is used as an etch stop layer during patterning of the layer 514 and the metal layer 516. In some embodiments, etching to form the patterned layer 514 and the patterned metal layer 516 includes forming a 2-D planar active region. In other embodiments, etching to form the patterned layer 514 and the patterned metal layer 516 includes forming a 3-D diode structure, as discussed below with reference to FIGS. 11-18.

Figure 6:
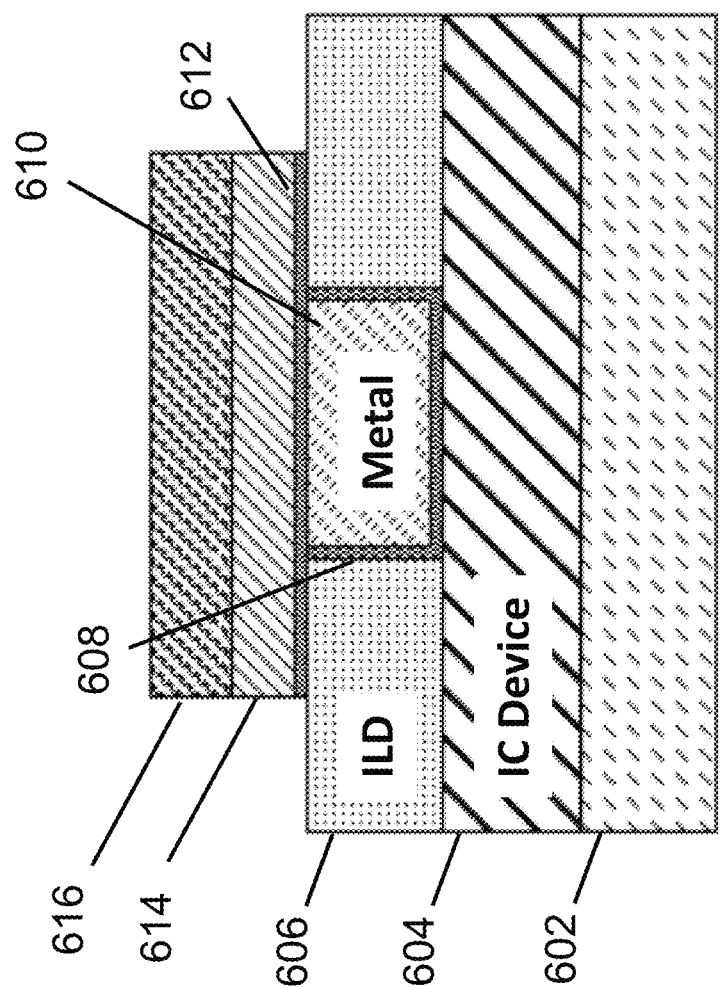
FIG. 6 shows a cross sectional view illustrating the formation of a stacked low temperature diode after silicidation of the semiconductor layer.

After formation of the patterned layer 514 and the patterned metal layer 516 (FIG. 5), a low-temperature anneal at about 300-400 degrees Celsius is performed to induce a reaction between the patterned metal layer 516 and the patterned layer 514. As shown in FIG. 6, the reaction between the patterned layer 514 and the patterned metal layer 516 forms a silicide layer, such as silicide layer 616. In some embodiments, prior to annealing to induce the reaction, a dopant species is implanted into the semiconductor layer (e.g., into the layer 314 of FIG. 3, the layer 414 of FIG. 4, or the layer 514 of FIG. 5). In other embodiments, prior to annealing to induce the reaction, a dopant species is implanted at a metal-semiconductor interface (e.g., at an interface defined by layer 414 and the metal layer 416 of FIG. 4, or by the layer 514 and the patterned metal layer 516 of FIG. 5). Depending on the type of metal used for the metal layer 516 (FIG. 5), the silicide layer 616 may include a platinum silicide (PtSi) layer, a nickel silicide (NiSi) layer, an erbium silicide (ErSi) layer, an ytterbium silicide (YbSi) layer, or a palladium silicide (PdSi) layer, among others. Unreacted metal is removed, for example, by way of a wet chemical etch. In some embodiments, the silicide layer 616 and the patterned semiconductor layer 614 define a silicide-semiconductor interface, where a silicide-semiconductor barrier height is modulated by incorporation of a dopant species at the silicide-semiconductor interface. The thermal budget used to induce the reaction between the patterned layer 514 and the patterned metal layer 516 (FIG. 5) and thus form the silicide layer 616 is low as compared to, for example, the thermal budget used for formation of the underlying plurality of IC devices within the IC device layer 604. Thus, formation of the stacked low temperature diode can be performed as a back-end process after higher thermal budget processing is complete and without degradation of the underlying plurality of IC devices within the IC device layer 604, for example, due to electromigration or dopant redistribution.

Figure 7:
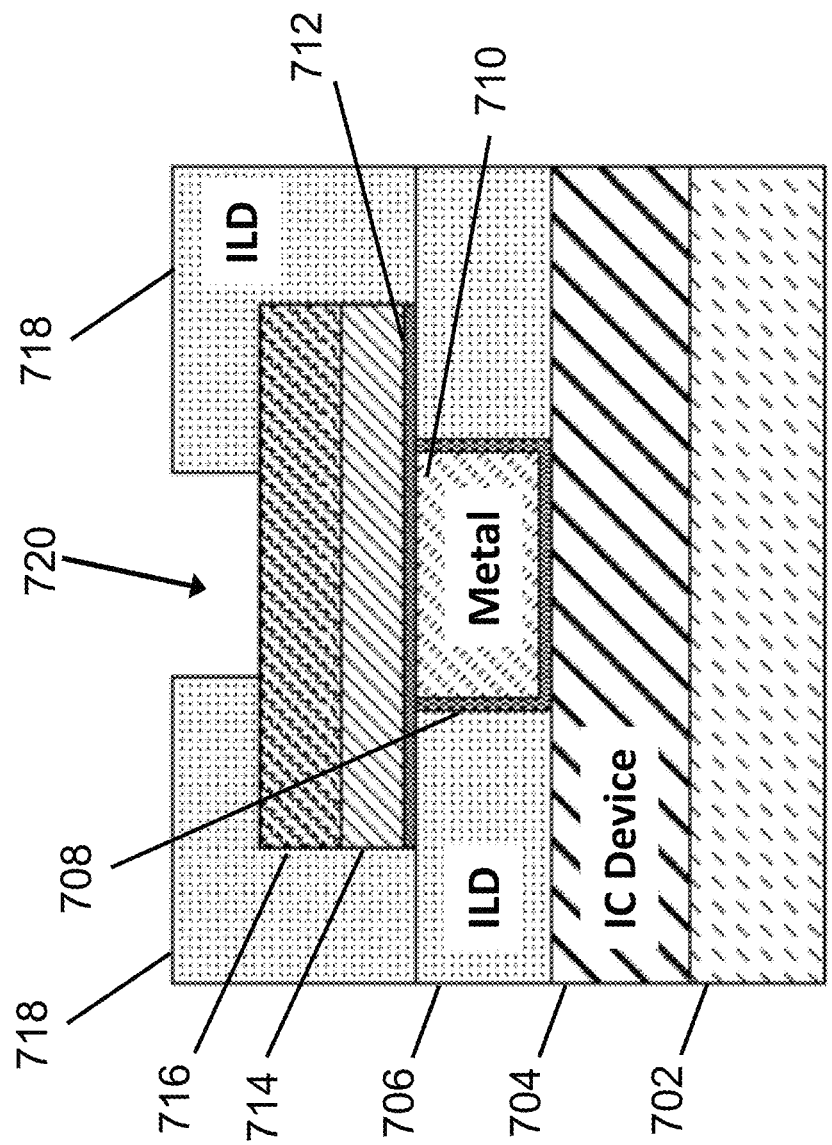
FIG. 7 shows a cross sectional view illustrating the formation of a stacked low temperature diode after formation of a dielectric layer including a contact hole.
Figure 8:
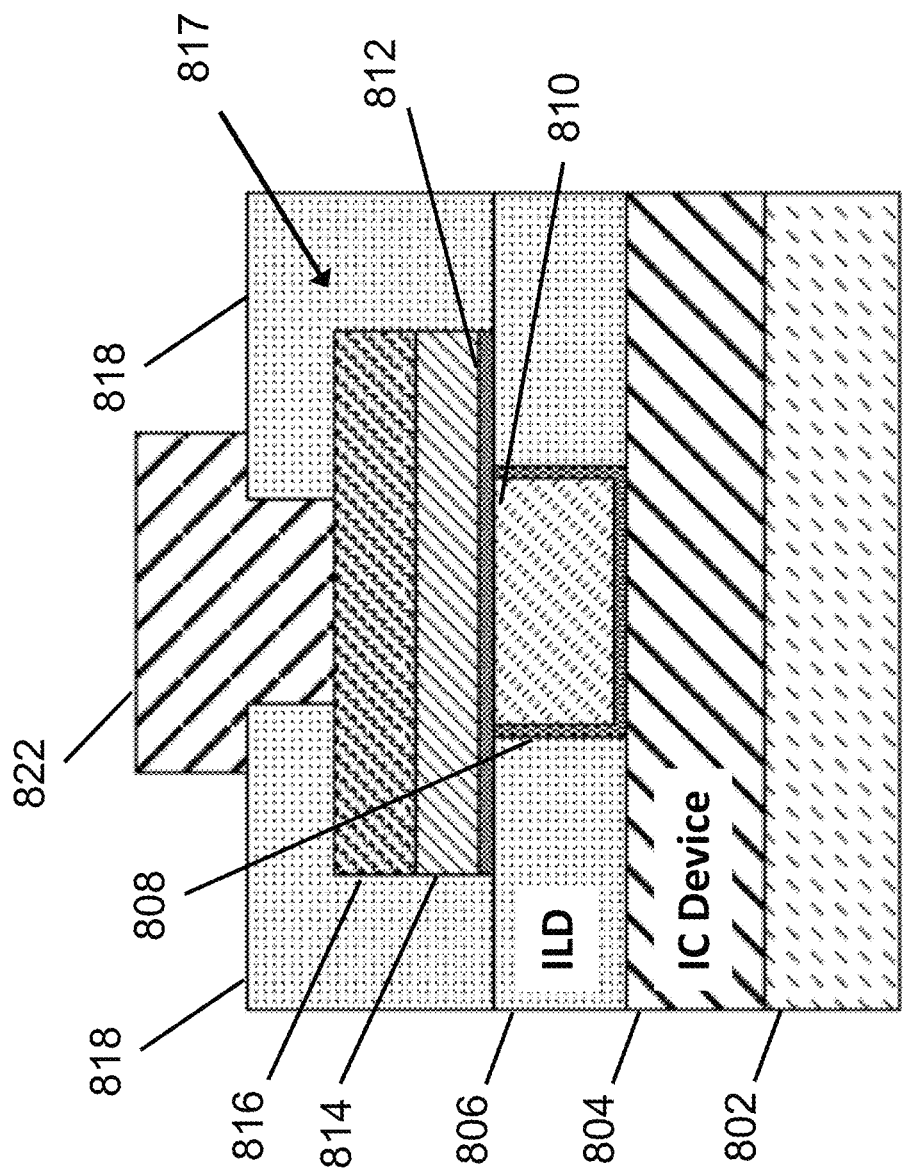
FIG. 8 shows a cross sectional view illustrating the formation of a stacked low temperature diode after formation of a metal layer in contact with the silicided semiconductor layer.

As shown in FIG. 7, an ILD layer 718 is deposited over the substrate 702. The ILD layer 718 is patterned and etched to open a contact hole 720 to the silicide layer 716, which serves as the P-N junction anode or cathode. Referring now to FIG. 8, after opening the contact hole 720 (FIG. 7), a metal layer is deposited over the substrate 802. The deposited metal layer is then patterned and etched to form patterned metal layer 822 and thus complete formation of P-N junction diode 817. Depending on whether the silicide layer 816 serves as the P-N junction anode or cathode, the metal layer 822 may comprise any of a plurality of metals. In some embodiments, the metal layer 822 includes an aluminum (Al) layer. In various embodiments, the metal layer 822 is deposited by PVD, ALD, plating or e-beam evaporation, among others, and the metal layer 822 has a thickness of about 5000-10000 Angstroms.

Figure 9:
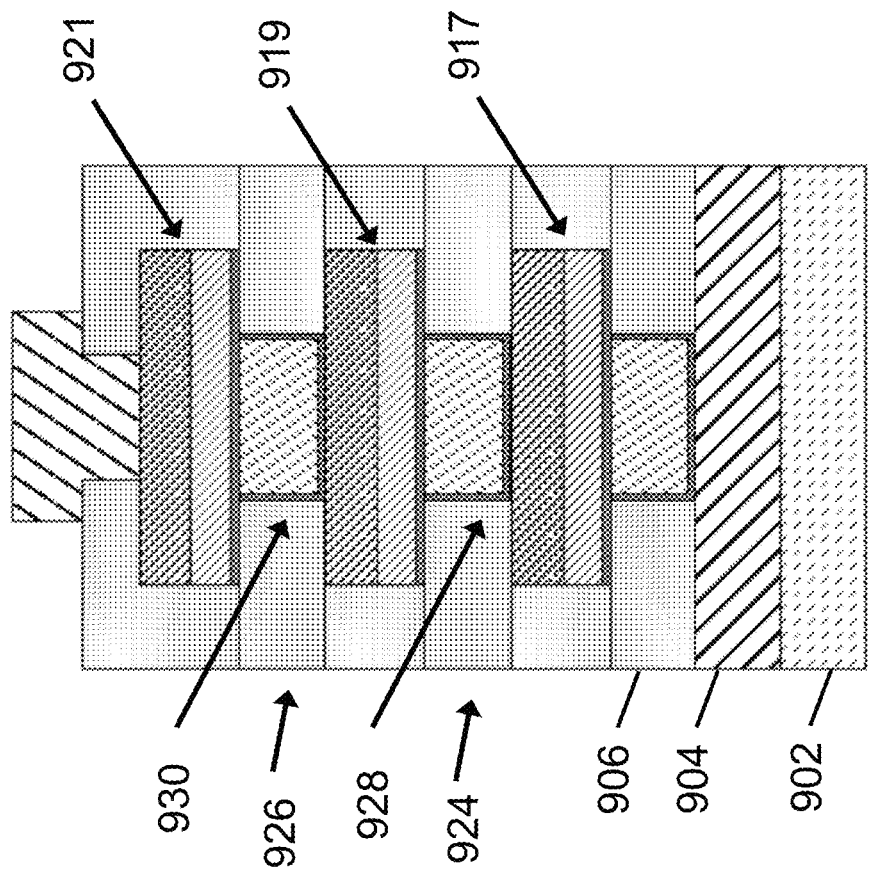
FIG. 9 shows a cross sectional view illustrating the formation of a plurality of stacked low temperature diodes.

FIG. 9 illustrates at least one IC device monolithically integrated with a plurality of stacked low temperature diodes 917, 919, 921, in accordance with some embodiments. While three stacked low temperature diodes are shown by way of example in FIG. 9, it should be understood that any number of low temperature diodes may be stacked. In some embodiments, each of the low temperature diodes 917, 919, 921 are formed in a similar manner as the low temperature diode 817 (FIG. 8). As shown in FIG. 9, dielectric layers, such as ILD layers 924, 926 provide for electrical isolation between each of the stacked diodes. Stacking of the low temperature diodes 917, 919, 921 can be used to increase the functionality of the IC chip without increasing its form factor and without using additional semiconductor real estate area. Moreover, one or more of the low temperature diodes 917, 919, 921 may be electrically coupled to each other in order to provide a higher ON-state current, for example by way of vertical electrical connections (VIAs) 928, 930 as compared to the ON-state current provided by a single low temperature stacked diode.

Figure 10:
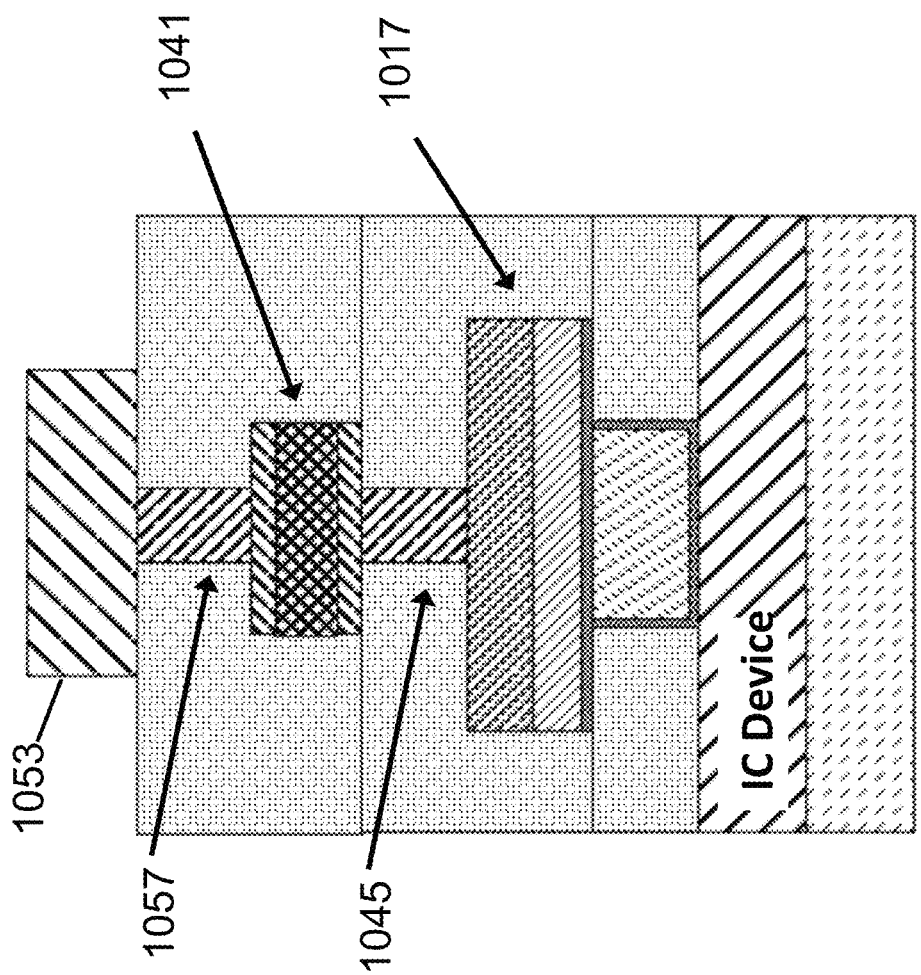
FIG. 10 shows a cross sectional view illustrating the formation of a stacked low temperature diode integrated with a memory cell.

FIG. 10 illustrates at least one IC device monolithically integrated with a stacked low temperature diode 1017 and with a memory cell 1041, in accordance with some embodiments. The low temperature diode 1017 and the memory cell 1041 may be electrically coupled by way of VIA 1045. Further, the memory cell 1041 may be electrically coupled to metal interconnect 1053 by way of VIA 1057. In various embodiments, low temperature diode 1017 may be used as a memory driver device to drive the memory cell 1041. Additionally, the memory cell 1041 may comprise one of a plurality of various types of memory cells, including ferroelectric random access memory (FeRAM), magnetic RAM (MRAM), Resistive RAM (RRAM), and phase-change RAM (PCRAM), among others. In other embodiments, the low temperature diode 1017 may be electrically coupled to one or more sensors, or other active and/or passive devices.

Figure 11:
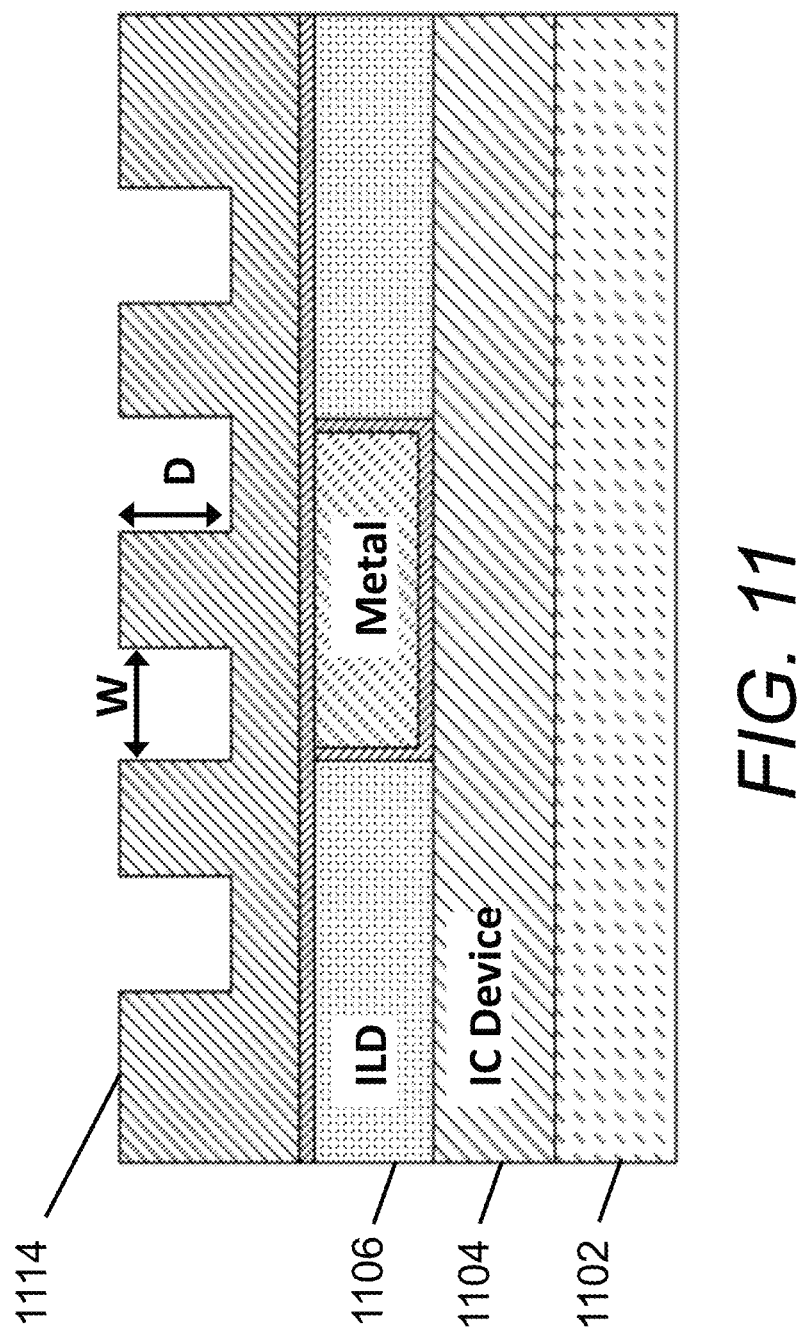
FIG. 11 shows a cross sectional view illustrating the formation of a stacked low temperature 3-D diode after patterning trenches within the semiconductor layer.

Returning to FIG. 3, the semiconductor layer 314 may be patterned and trenches may be etched in the semiconductor layer 314 to form a 3-D diode structure as shown in FIG. 11, which illustrates the 3-D patterned semiconductor layer 1114. The 3-D patterned semiconductor layer 1114 effectively increases the area of the P-N junction diode and thus increases the P-N diode current. In various embodiments, the width (W) and depth (D) of the trenches are about 200-5000 Angstroms.

Figure 12:
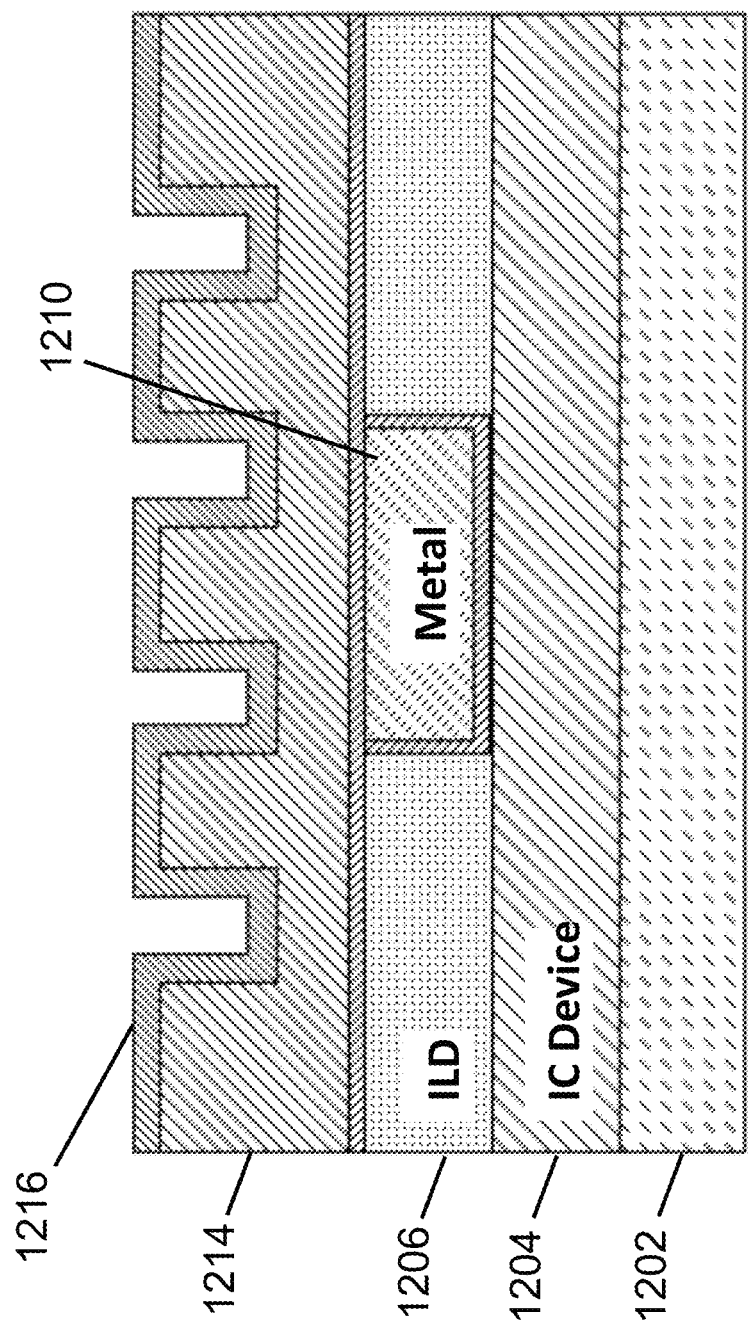
FIG. 12 shows a cross sectional view illustrating the formation of a stacked low temperature 3-D diode after deposition of a metal layer over the semiconductor layer.

FIG. 12 illustrates a metal layer 1216 is deposited over the substrate 1202. Depending on the doping of the 3-D patterned semiconductor layer 1214, and thus depending on whether the metal layer 1210 serves as a P-N junction anode or cathode, the metal layer 1216 may comprise any of a plurality of metals. For example, when the 3-D patterned semiconductor layer 1214 is used as the cathode, the metal layer 1216 may include Pt or Ni, which will be used to form the anode. Alternatively, when the 3-D patterned semiconductor layer 1214 is used as the anode, the metal layer 1216 may include Er, Yb, or Pd, which will be used to form the cathode. The metal layer 1216 serves as a precursor to silicidation of the anode/cathode within the 3-D patterned semiconductor layer 1214. In various embodiments, the metal layer 1216 is deposited by PVD, ALD, or e-beam evaporation, among others, and the metal layer 1216 has a thickness of about 50-500 Angstroms.

Figure 13:
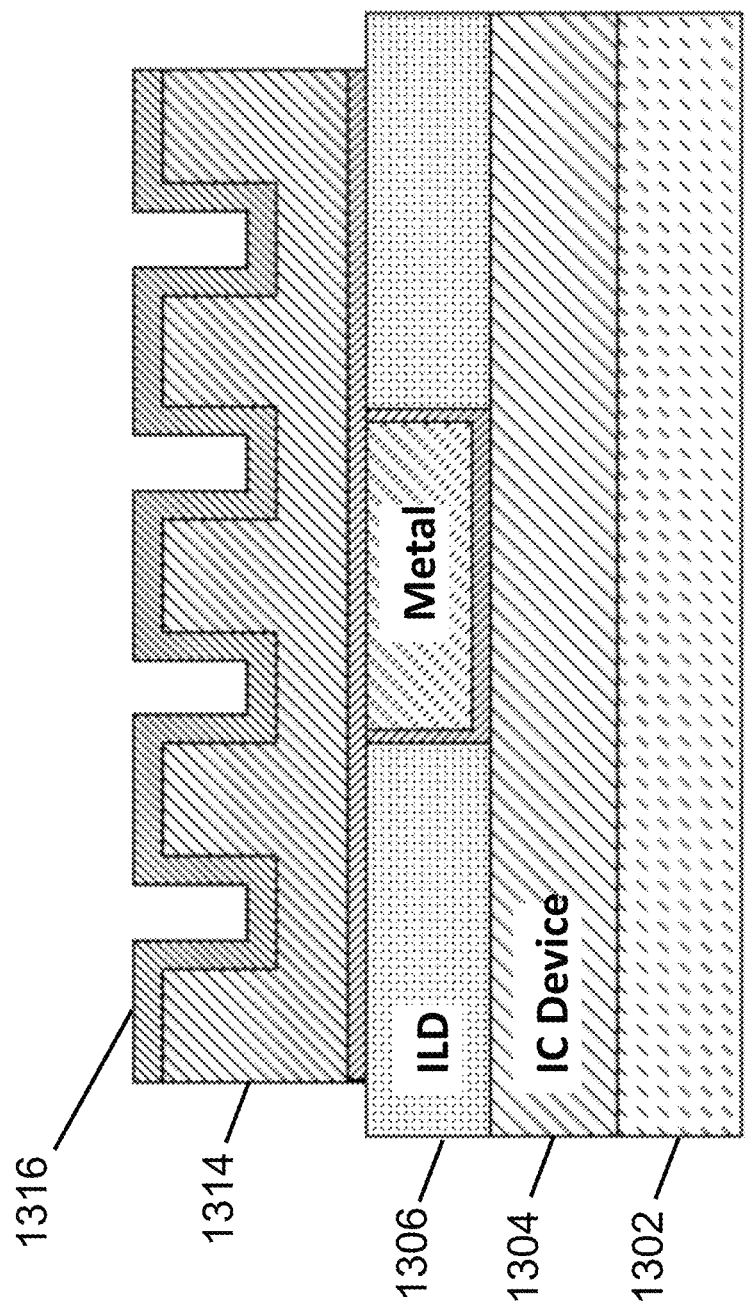
FIG. 13 shows a cross sectional view illustrating the formation of a stacked low temperature 3-D diode after patterning the semiconductor layer and the metal layer.

As shown in FIG. 13, the 3-D patterned semiconductor layer 1214 (FIG. 12) and metal layer 1216 (FIG. 12) are then patterned and etched to form an active region including 3-D patterned semiconductor layer 1314 and patterned metal layer 1316. The patterning can be accomplished by way of a photolithographic process. In various embodiments, ILD layer 1306 is used as an etch stop layer during patterning of the 3-D patterned semiconductor layer 1314 and the metal layer 1316.

Figure 14:
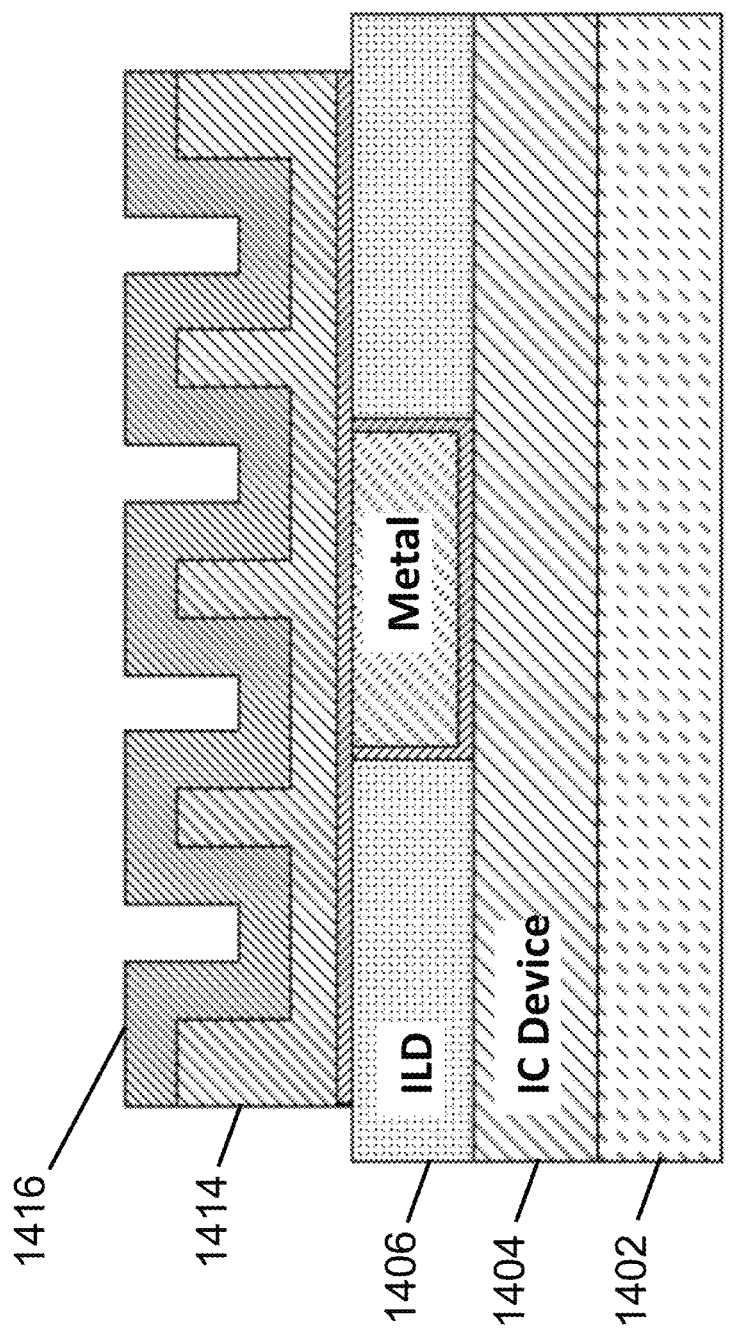
FIG. 14 shows a cross sectional view illustrating the formation of a stacked low temperature 3-D diode after silicidation of the semiconductor layer.

Referring now to FIG. 14, after formation of the 3-D patterned semiconductor layer 1314 (FIG. 13) and the patterned metal layer 1316 (FIG. 13), a low-temperature anneal at about 300-400 degrees Celsius is performed to induce a reaction between the patterned metal layer 1316 (FIG. 13) and the 3-D patterned semiconductor layer 1314 (FIG. 13). As shown in FIG. 14, the reaction between the 3-D patterned semiconductor layer 1314 and the patterned metal layer 1316 forms a silicide layer, such as silicide layer 1416. Depending on the type of metal used for the metal layer 1316 (FIG. 13), the silicide layer 1416 may include a PtSi layer, a NiSi layer, an ErSi layer, an YbSi layer, or a PdSi layer, among others. Unreacted metal is removed, for example, by way of a wet chemical etch. The thermal budget used to induce the reaction between the 3-D patterned semiconductor layer 1314 and the patterned metal layer 1316 (FIG. 13) and thus form the silicide layer 1416 is low as compared to, for example, the thermal budget used for formation of the underlying plurality of IC devices within the IC device layer 1404. Thus, formation of the stacked low temperature 3-D diode can be performed as a back-end process after higher thermal budget processing is complete and without degradation of the underlying plurality of IC devices within the IC device layer 1404, for example, due to electromigration or dopant redistribution.

Figure 15:
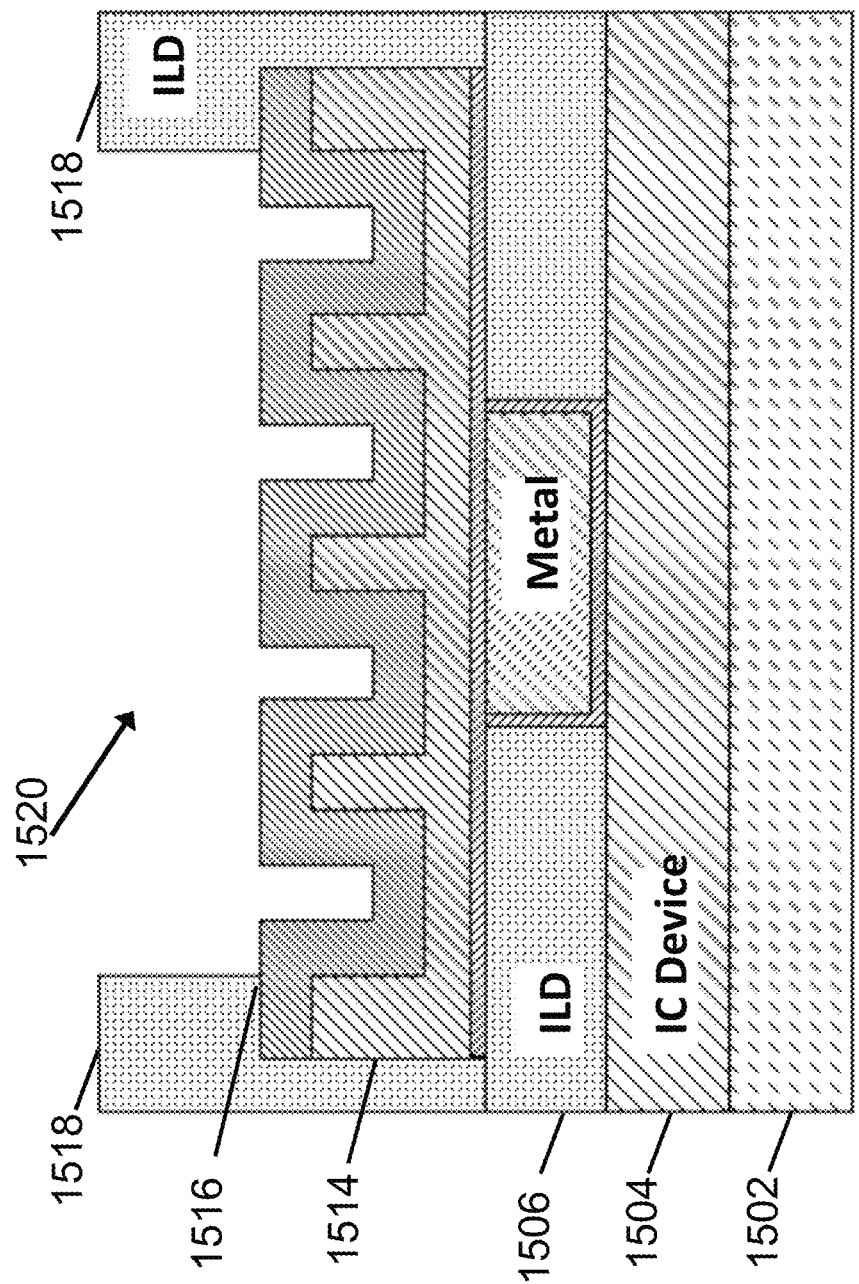
FIG. 15 shows a cross sectional view illustrating the formation of a stacked low temperature 3-D diode after formation of a dielectric layer including a contact hole.
Figure 16:
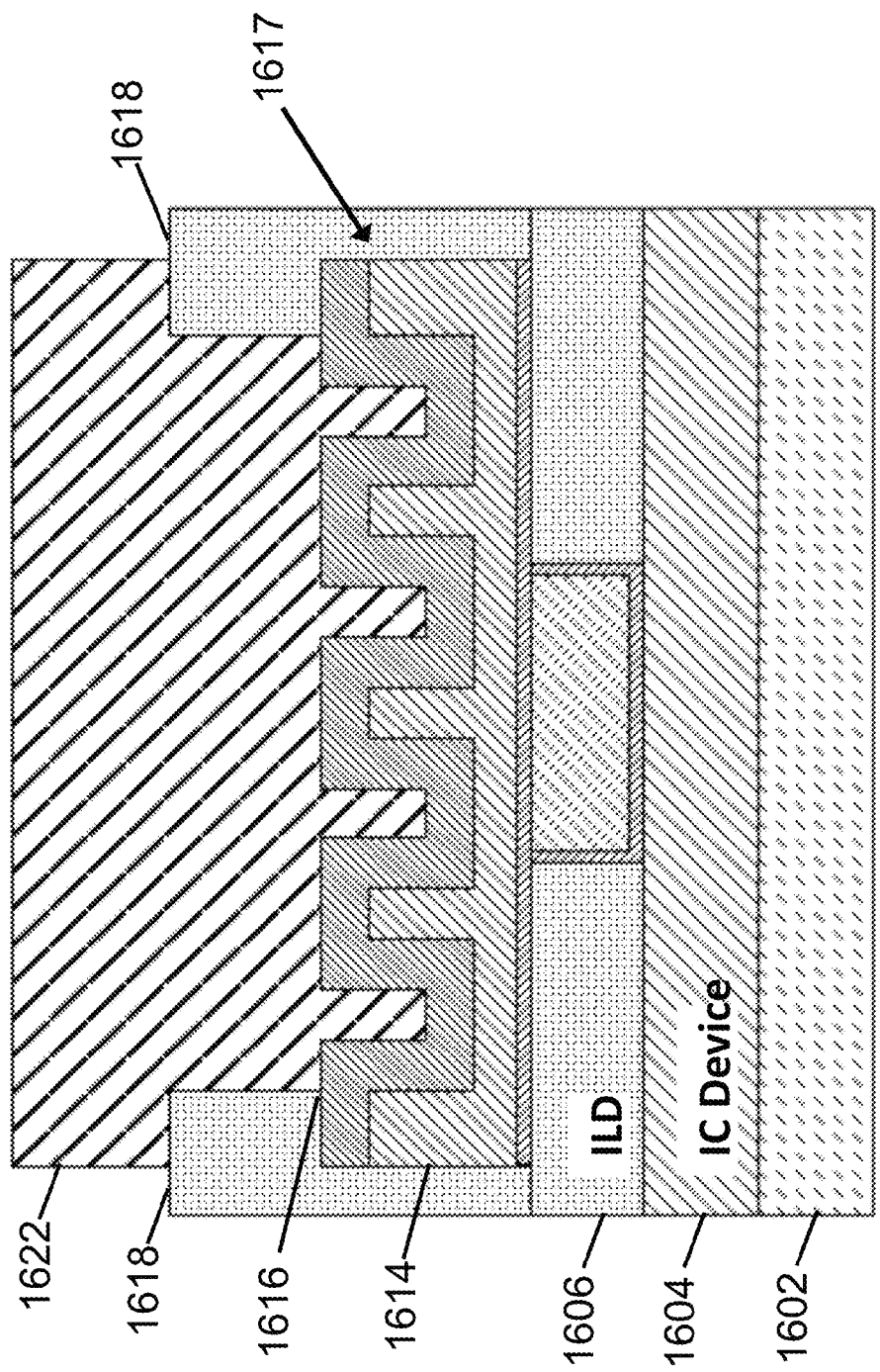
FIG. 16 shows a cross sectional view illustrating the formation of a stacked low temperature 3-D diode after formation of a metal layer in contact with the silicided semiconductor layer.

As shown in FIG. 15, an ILD layer 1518 is deposited over the substrate 1502. The ILD layer 1518 is patterned and etched to open a contact hole 1520 to the silicide layer 1516, which serves as the P-N junction anode or cathode. Referring now to FIG. 16, after opening the contact hole 1520 (FIG. 15), a metal layer is deposited over the substrate 1602. The deposited metal layer is then patterned and etched to form patterned metal layer 1622 and thus complete formation of 3-D P-N junction diode 1617. Depending on whether the silicide layer 1616 serves as the P-N junction anode or cathode, the metal layer 1622 may comprise any of a plurality of metals. In some embodiments, the metal layer 1622 includes an Al layer. In various embodiments, the metal layer 1622 is deposited by PVD, ALD, or e-beam evaporation, among others, and the metal layer 1622 has a thickness of about 5000-10000 Angstroms.

Figure 17:
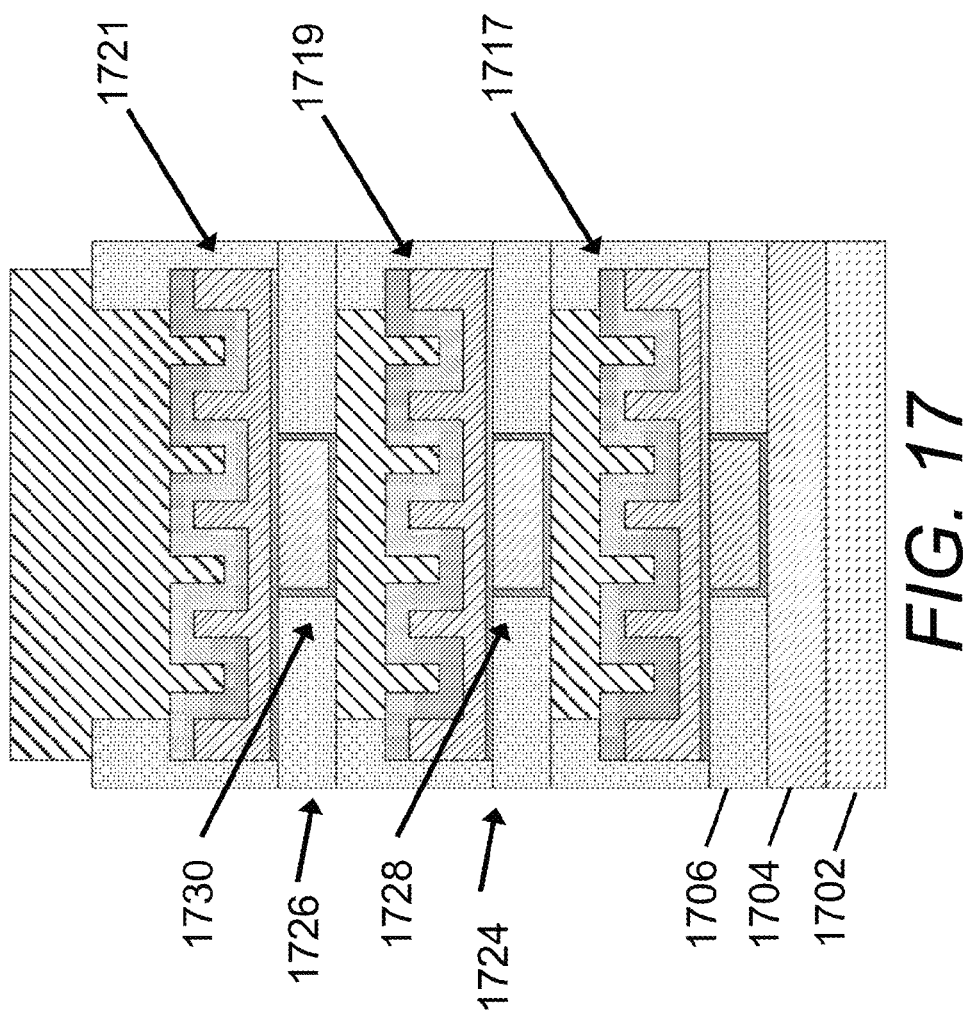
FIG. 17 shows a cross sectional view illustrating the formation of a plurality of stacked low temperature 3-D diodes.

FIG. 17 illustrates at least one IC device monolithically integrated with a plurality of stacked low temperature 3-D diodes 1717, 1719, 1721, in accordance with some embodiments. While three stacked low temperature 3-D diodes are shown by way of example in FIG. 17, it should be understood that any number of low temperature 3-D diodes may be stacked. In some embodiments, each of the low temperature 3-D diodes 1717, 1719, 1721 are formed in a similar manner as the low temperature 3-D diode 1617 (FIG. 16). As shown in FIG. 17, dielectric layers, such as ILD layers 1724, 1726 provide for electrical isolation between each of the stacked 3-D diodes. Stacking of the low temperature 3-D diodes 1717, 1719, 1721 can be used to increase the functionality of the IC chip without increasing its form factor and without using additional semiconductor real estate area. Moreover, one or more of the low temperature 3-D diodes 1717, 1719, 1721 may be electrically coupled to each other in order to provide a higher ON-state current, for example by way of vertical electrical connections (VIAs) 1728, 1730 as compared to the ON-state current provided by a single low temperature stacked 3-D diode.

Figure 18:
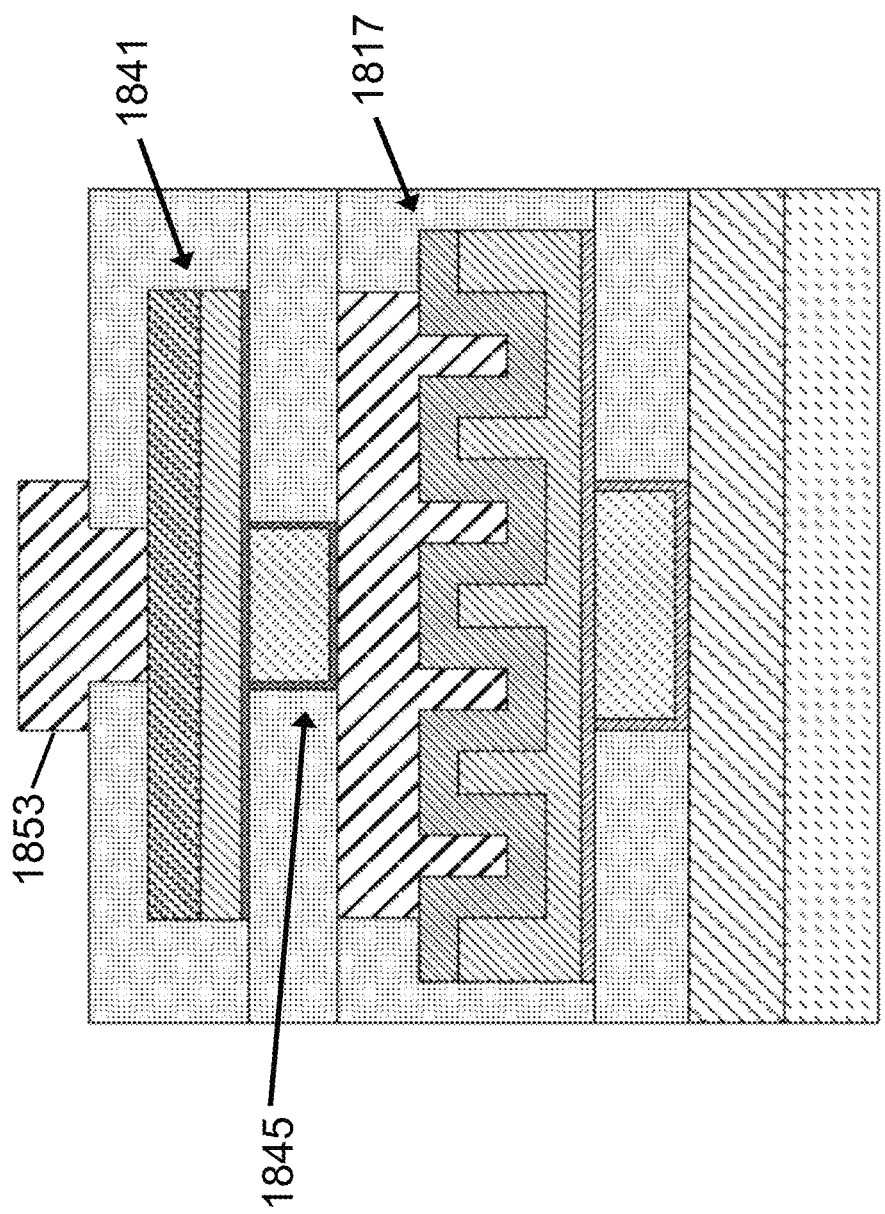
FIG. 18 shows a cross sectional view illustrating the formation of a stacked low temperature 3-D diode integrated with a memory cell.

FIG. 18 illustrates at least one IC device monolithically integrated with a stacked low temperature 3-D diode 1817 and with a memory cell 1841, in accordance with some embodiments. The low temperature 3-D diode 1817 and the memory cell 1841 may be electrically coupled by way of VIA 1845. Further, the memory cell 1841 may be electrically coupled to metal interconnect 1853. In various embodiments, low temperature 3-D diode 1817 may be used as a memory driver device to drive the memory cell 1841. In particular, since the 3-D diode 1817 drives more current than a similarly-sized planar diode, the 3-D diode 1817 may be used as a memory driver device when the memory cell 1841 requires a higher drive current than can be provided by the similarly-sized planar diode. Additionally, the memory cell 1841 may comprise one of a plurality of various types of memory cells, including ferroelectric random access memory (FeRAM), magnetic RAM (MRAM), Resistive RAM (RRAM), and phase-change RAM (PCRAM), among others. In other embodiments, the low temperature 3-D diode 1817 may be electrically coupled to one or more sensors, or other active and/or passive devices.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

Furthermore, while the above discussion is meant to be illustrative of the principles and various embodiments of the present invention, numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:

1. A method comprising:
    forming a metal interconnect disposed within an inter-layer dielectric, wherein the metal interconnect is electrically coupled to at least one underlying integrated circuit device;
    depositing a barrier layer on the metal interconnect and the inter-layer dielectric;
    depositing a semiconductor layer on the barrier layer;
    depositing a metal layer on the semiconductor layer;
    patterning the barrier layer, the semiconductor layer, and the metal layer; and
    annealing to induce a reaction between the patterned metal layer and the patterned semiconductor layer, wherein the reaction forms a silicided layer within the patterned semiconductor layer, and wherein the reaction forms a P-N junction diode.

2. The method of claim 1, wherein annealing to induce the reaction includes thermal processing at a temperature of less than about 600 degrees Celsius.

3. The method of claim 1, wherein annealing to induce the reaction includes laser annealing at an energy density of about 500-1000 mJ/cm$^2$.

4. The method of claim 1, further comprising removing unreacted metal of the metal layer.

5. The method of claim 1, wherein the patterning the barrier layer further comprises etching the barrier layer, the semiconductor layer, and the metal layer to form an active region including one active region selected from a group comprising: a 2-D planar active region; and a 3-D fin-type active region.

6. The method of claim 1, further comprising prior to annealing, implanting a dopant species into the semiconductor layer.

7. The method of claim 1, further comprising prior to annealing, implanting a dopant species at a metal-semiconductor interface.

8. The method of claim 1, wherein the depositing the semiconductor layer further comprises depositing an in-situ doped semiconductor layer including at least one of an N-type dopant and a P-type dopant.

9. The method of claim 1, wherein the semiconductor layer includes one of a gradient dopant profile and a bilayer dopant profile.

10. The method of claim 1, wherein the silicided layer within the patterned semiconductor layer defines a silicide-semiconductor interface, and wherein a silicide-semiconductor barrier height is modulated by incorporation of a dopant species at the silicide-semiconductor interface.

11. The method of claim 1, wherein the semiconductor layer comprises a semiconductor layer selected from a group comprising: an amorphous silicon (a-Si) layer; a polycrystalline Si (poly-Si) layer; a single crystal Si layer; an amorphous silicon-germanium (a-SiGe) layer; a polycrystalline silicon germanium (poly-SiGe) layer; a single crystalline SiGe layer; an amorphous germanium (a-Ge) layer; a polycrystalline germanium (poly-Ge) layer; a single crystal Ge layer; and a silicon carbide (SiC) layer.

12. The method of claim 1, wherein depositing the semiconductor layer includes depositing the semiconductor layer having a thickness of about 2000-5000 Angstroms.

13. The method of claim 1, wherein depositing the barrier layer includes depositing the barrier layer having a thickness of about 50-500 Angstroms.

14. The method of claim 1, wherein depositing the metal layer includes depositing the metal layer having a thickness of about 50-500 Angstroms.

15. The method of claim 1, wherein the metal layer includes one of a platinum layer, nickel layer an erbium layer, an ytterbium layer, and a palladium layer.

16. The method of claim 1, further comprising:
depositing a dielectric layer on the patterned semiconductor layer;
opening a contact hole to the silicided layer within the patterned semiconductor layer; and
depositing a contact metal layer, wherein the contact metal layer electrically couples to the silicided layer within the patterned semiconductor layer via the contact hole.

17. The method of claim 16, further comprising forming a memory cell disposed above the contact metal layer, wherein the memory cell is electrically coupled to the P-N junction diode by way of the contact metal layer.

18. The method of claim 17, wherein the memory cell includes one of a ferroelectric random access memory (FeRAM) cell, a magnetic RAM (MRAM) cell, a resistive RAM (RRAM) cell, and a phase-change RAM (PCRAM) cell.

19. A method comprising:
forming a metal interconnect disposed within an inter-layer dielectric, wherein the metal interconnect is electrically coupled to at least one underlying integrated circuit device;
forming a first low-temperature P-N junction diode on the metal interconnect; and
forming a second low-temperature P-N junction diode on the first low-temperature P-N junction diode, wherein the second low-temperature P-N junction diode is electrically coupled to the first low-temperature P-N junction diode by way of a first VIA.

20. The method of claim 19, further comprising forming a third low-temperature P-N junction diode on the second low-temperature P-N junction diode, wherein the third low-temperature P-N junction diode is electrically coupled to the second low-temperature P-N junction diode by way of a second VIA.

21. A semiconductor device comprising:
a metal interconnect disposed within an inter-layer dielectric, wherein the metal interconnect is electrically coupled to at least one underlying integrated circuit device;
a barrier layer on the metal interconnect and the inter-layer dielectric;
a semiconductor layer on the barrier layer; and
a metal layer on the semiconductor layer;
wherein the barrier layer, the semiconductor layer, and the metal layer are patterned; and
wherein the semiconductor device is annealed to induce a reaction between the patterned metal layer and the patterned semiconductor layer, wherein the reaction forms a silicided layer within the patterned semiconductor layer, and wherein the reaction forms a P-N junction diode.

22. The semiconductor device of claim 21, wherein the patterned barrier layer, the patterned semiconductor layer, and the patterned metal layer form an active region including one active region selected from a group comprising: a 2-D planar active region; and a 3-D fin-type active region.

23. The semiconductor device of claim 21, wherein the semiconductor layer comprises a semiconductor layer selected from a group comprising: an amorphous silicon (a-Si) layer; a polycrystalline Si (poly-Si) layer; a single crystal Si layer; an amorphous silicon-germanium (a-SiGe) layer; a polycrystalline silicon germanium (poly-SiGe) layer; a single crystalline SiGe layer; an amorphous germanium (a-Ge) layer; a polycrystalline germanium (poly-Ge) layer; a single crystal Ge layer; and a silicon carbide (SiC) layer.

24. The semiconductor device of claim 21, wherein the metal layer includes one of a platinum layer, nickel layer an erbium layer, an ytterbium layer, and a palladium layer.

25. The semiconductor device of claim 21, further comprising:
a dielectric layer on the patterned semiconductor layer;
a contact hole which provides an opening to the silicided layer within the patterned semiconductor layer; and
a contact metal layer disposed within the contact hole, wherein the contact metal layer electrically couples to the silicided layer within the patterned semiconductor layer.

26. The semiconductor device of claim 25, further comprising a memory cell disposed above the contact metal layer, wherein the memory cell is electrically coupled to the P-N junction diode by way of the contact metal layer.

27. The semiconductor device of claim 26, wherein the memory cell includes one of a ferroelectric random access memory (FeRAM) cell, a magnetic RAM (MRAM) cell, a resistive RAM (RRAM) cell, and a phase-change RAM (PCRAM) cell.

* * * * *